(12) United States Patent
Tsutsumi et al.

(10) Patent No.: US 9,099,615 B2
(45) Date of Patent: Aug. 4, 2015

(54) LIGHT EMITTING DEVICE THAT INCLUDES WAVELENGTH CONVERSION LAYER HAVING OUTER PERIPHERAL PORTION HAVING CONVEX PROJECTING PART WITH LIGHT REFLECTION LAYER FORMED THEREON

(71) Applicants: Yasuaki Tsutsumi, Shizuoka (JP); Masanobu Mizuno, Shizuoka (JP); Yasutaka Sasaki, Shizuoka (JP); Mitsutoshi Higashi, Nagano (JP); Akinori Shiraishi, Nagano (JP); Rie Arai, Nagano (JP)

(72) Inventors: Yasuaki Tsutsumi, Shizuoka (JP); Masanobu Mizuno, Shizuoka (JP); Yasutaka Sasaki, Shizuoka (JP); Mitsutoshi Higashi, Nagano (JP); Akinori Shiraishi, Nagano (JP); Rie Arai, Nagano (JP)

(73) Assignees: Koito Manufacturing Co., Ltd., Tokyo (JP); Shinko Electric Industries Co., Ltd., Nagano (JP)

( * ) Notice: Subject to any disclaimer, the term of this patent is extended or adjusted under 35 U.S.C. 154(b) by 245 days.

(21) Appl. No.: 13/670,536

(22) Filed: Nov. 7, 2012

(65) Prior Publication Data

US 2013/0121009 A1     May 16, 2013

(30) Foreign Application Priority Data

Nov. 14, 2011   (JP) ................................ 2011-248523

(51) Int. Cl.
*H01L 33/50*     (2010.01)
*H01L 33/46*     (2010.01)
*H01L 33/44*     (2010.01)

(52) U.S. Cl.
CPC ............... *H01L 33/46* (2013.01); *H01L 33/44* (2013.01); *H01L 33/507* (2013.01); *H01L 2933/0091* (2013.01)

(58) Field of Classification Search
CPC ..................................................... H01L 33/507
See application file for complete search history.

(56) References Cited

U.S. PATENT DOCUMENTS

| | | | |
|---|---|---|---|
| 2010/0099208 A1* | 4/2010 | Harada | 438/27 |
| 2010/0264438 A1 | 10/2010 | Suenaga | |
| 2010/0315802 A1* | 12/2010 | Richardson | 362/84 |
| 2011/0032702 A1* | 2/2011 | Mizuno | 362/247 |
| 2012/0092850 A1* | 4/2012 | Pickard | 362/84 |
| 2014/0146547 A1* | 5/2014 | Tsutsumi et al. | 362/343 |

FOREIGN PATENT DOCUMENTS

| | | |
|---|---|---|
| CN | 102187478 A | 9/2011 |
| CN | 102187485 A | 9/2011 |
| JP | 2009-206294 | 9/2009 |
| JP | 2010-123605 | 6/2010 |
| JP | 2010-272847 | 12/2010 |

OTHER PUBLICATIONS

State Intellectual Property Office of the People's Republic of China, official communication in patent appln No. 201210451064.4 (Jan. 20, 2015) (and English-language translation).

\* cited by examiner

*Primary Examiner* — Stephen W Smoot
(74) *Attorney, Agent, or Firm* — Fish & Richardson P.C.

(57) ABSTRACT

A light emitting device is provided with a semiconductor light emitting element and a wavelength conversion portion. The wavelength conversion portion includes an outer peripheral portion between an input surface and an output surface. The outer peripheral portion includes a first inclined part at a side of the input surface and a second inclined part at a side of the output surface. The first inclined part and the second inclined part define a projecting portion that is projected on the outer peripheral portion.

9 Claims, 10 Drawing Sheets

FIG.12

| | Outer periphery of wavelength conversion layer | Light reflection layer | Area of output surface against input surface | Concavo convex shape | Reflection prevention film | Band pass filter | Diffusion component | Shielding film | Luminance (relative value) |
|---|---|---|---|---|---|---|---|---|---|
| Embodiment 1 | Convex outwardly | Exist | Same | Not Exist | Not Exist | Not Exist | Not Exist | Not Exist | 1.22 |
| Embodiment 2 | Convex outwardly | Exist | Small | Not Exist | Not Exist | Not Exist | Not Exist | Not Exist | 1.46 |
| Embodiment 3 | Convex outwardly | Exist | Same | Exist | Not Exist | Not Exist | Not Exist | Not Exist | 1.53 |
| Embodiment 4 | Convex outwardly | Exist | Same | Not Exist | Exist | Not Exist | Not Exist | Not Exist | 1.28 |
| Embodiment 5 | Convex outwardly | Exist | Same | Exist | Exist | Not Exist | Not Exist | Not Exist | 1.54 |
| Embodiment 6 | Convex outwardly | Exist | Same | Not Exist | Not Exist | Exist | Not Exist | Not Exist | 1.32 |
| Embodiment 7 | Convex outwardly | Exist | Small | Not Exist | Not Exist | Exist | Not Exist | Not Exist | 1.59 |
| Embodiment 8 | Convex outwardly | Exist | Small | Not Exist | Not Exist | Exist | Exist | Not Exist | 2.54 |
| Embodiment 9 | Convex outwardly | Exist | Small | Exist | Exist | Exist | Exist | Not Exist | 3.30 |
| Embodiment 10 | Convex outwardly | Exist | Small | Not Exist | Not Exist | Not Exist | Not Exist | Exist | 2.63 |
| Comparative Example 1 | Vertical | Not Exist | Same | Not Exist | Not Exist | Not Exist | Not Exist | Not Exist | 1.00 |
| Comparative Example 2 | Vertical | Exist | Same | Not Exist | Not Exist | Not Exist | Not Exist | Not Exist | 0.87 |

LIGHT EMITTING DEVICE THAT INCLUDES WAVELENGTH CONVERSION LAYER HAVING OUTER PERIPHERAL PORTION HAVING CONVEX PROJECTING PART WITH LIGHT REFLECTION LAYER FORMED THEREON

BACKGROUND OF THE INVENTION

1. Field of the Invention

The present invention relates to a light emitting device.

2. Related Art

As a light source of a general lighting equipment or a vehicle headlight, an incandescent lamp, a halogen lamp, or a discharge lamp has been widely used. Recently, from a viewpoint of global warming prevention and long-term lifespan, a semiconductor light emitting element, such as a LED (Light Emitting Diode) and an organic EL (Electro Luminescence), has been used (for example, refer to Patent Document 1 and Patent Document 2).

Patent Document 1: JP-A-2010-123605
Patent Document 2: JP-A-2009-206294

Since the semiconductor light emitting element has a low light emitting efficiency, it is necessary to mount a plurality of light emitting chips, in order to utilize the semiconductor light emitting element, for example, as the light source of the vehicle headlight. As a result, there was a disadvantage that a manufacturing cost is increased.

Accordingly, in the light emitting device using the semiconductor light emitting element, particularly, in the light emitting device that is used for the vehicle headlight, it is important to improve a light emitting efficiency and a light density (luminance) in order to properly control a light distribution, in addition to an increase of an entire light quantity of the light emitting device.

As the light emitting device using the semiconductor light emitting element, a light emitting device that emits white light is widely used. In the light emitting device that emits white light, for example, a semiconductor light emitting element that emits blue light (that is, a blue light emitting diode) and a wavelength conversion layer (e.g. a yellow phosphor layer) that is excited by the light emitted from the semiconductor light emitting element are provided. In the light emitting device, yellow light is excited as a result that a part of the blue light is absorbed in the phosphor, and the blue light that has passed through the wavelength conversion layer and the excited yellow light are mixed to emit pseudo white light to outside.

Accordingly, in the light emitting device using the semiconductor light emitting element and the wavelength conversion layer, it is important to emit light without color non-uniformity to outside as an illumination light by properly mixing the light emitted from the semiconductor light emitting element and the excited light.

In the light emitting devices described in Patent Document 1 and Patent Document 2, a semiconductor light emitting element is arranged in a concave portion. Light emitted from the semiconductor light emitting element and directs sideward is reflected on an inner peripheral surface (reflection surface) of the concave portion, and the light is guided to an open surface side of the concave portion to emit the light to the outside.

If the reflection surface is perpendicular to the emitting surface of the semiconductor light emitting element, repeated reflection of the light would occur and a loss of light through heat would occur. Accordingly, in the light emitting devices described in Patent Document 1 and Patent Document 2, the reflection surface is inclined outwardly as it goes in an emitting direction so as to approximate a reflection direction to the emitting direction and to improve the light emitting efficiency.

However, in the light emitting devices described in Patent Document 1 and Patent Document 2, since the reflection surface is inclined to be displaced to the outside as it goes in the emitting direction, the open surface of the concave portion that is an exit surface of the light has a large area, and thus the density (luminance) of the emitted light becomes lowered.

Further, since the concave portion is formed to be expanded as it approximates the exit surface, the quantity of the blue light emitted from the emitting surface of the semiconductor light emitting element and reaches the outer peripheral side of the concave portion is decreased, and an amount of the blue light with respect to the yellow light is decreased. As a result, a proper mixing of the lights is not performed, and this may cause the color non-uniformity to occur.

SUMMARY OF THE INVENTION

One or more embodiments provide a light emitting device which can improve light emitting efficiency and suppress color non-uniformity.

In accordance with an embodiment, a light emitting device may include a semiconductor light emitting element and a wavelength conversion layer. The semiconductor light emitting element may include an emitting surface. The wavelength conversion layer may include: an input surface which is positioned to face the emitting surface of the semiconductor light emitting element and to which light emitted from the emitting surface of the semiconductor light emitting element is incident; an output surface from which the light that is incident to the input surface is emitted to an outside; and an outer peripheral portion positioned between the input surface and the output surface. At least a part of the outer peripheral portion of the wavelength conversion layer may include a projecting portion that is convex to an outer side. The projecting portion may have a first inclined part continued from the input surface and a second inclined part continued from the output surface. A light reflection layer may be provided on the outer peripheral portion of the wavelength conversion layer to reflect the light incident through the input surface. A first reflection surface that is in contact with the first inclined part and a second reflection surface that is in contact with the second inclined part may be formed on the light reflection layer.

According to the light emitting device of an embodiment, light that propagates to a side of an outer peripheral surface of a wavelength conversion layer among light emitted from a semiconductor light emitting element is reflected by a light reflection layer and is emitted from an output surface.

Other aspects and advantages of the invention will be apparent from the following description and the appended claims.

BRIEF DESCRIPTION OF THE DRAWINGS

FIG. 12 is a table showing respective forms of embodiment 1 to embodiment 10, and comparative examples.

FIG. 18 is a conceptual view illustrating a state where a deposition film is formed on the surface of a material or the like.

DETAILED DESCRIPTION OF THE EMBODIMENTS

Figure 1:
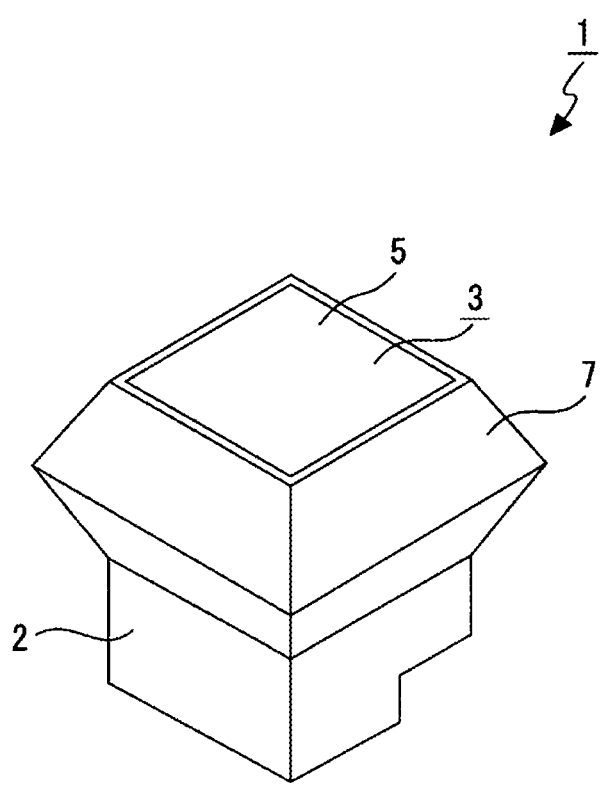
FIG. 1 is a perspective view of a light emitting device according to embodiment 1.

Embodiments of the invention will be described with reference to the accompanying drawings.

First, respective light emitting devices according to embodiment 1 to embodiment 10 will be described (see FIGS. 1 to 11).

A light emitting device has a semiconductor light emitting element and a wavelength conversion layer, and in the following description, front, rear, upper, lower, left, and right directions will be described on the assumption that the wavelength conversion layer is arranged on an upper side of the semiconductor light emitting device. The front, rear, upper, lower, left, and right directions illustrated hereinafter are for convenience in explanation. When the invention is implemented, the directions are not limited thereto.

The configurations of light emitting devices according to embodiment 2 to embodiment 10 are partially different from the configuration of a light emitting device according to embodiment 1. Accordingly, only portions of the light emitting devices according to embodiment 2 to embodiment 10 that are different from the light emitting device according to embodiment 1 will be described in detail, but with respect to other portions, the same reference numerals as those of the light emitting device according to embodiment 1 will be given, and the description thereof will be omitted.

Further, in the light emitting devices according to embodiment 2 to embodiment 10, the same reference numerals will be given to the same configurations as already described, and simple explanation thereof will be made.

<Embodiment 1>

Figure 2:
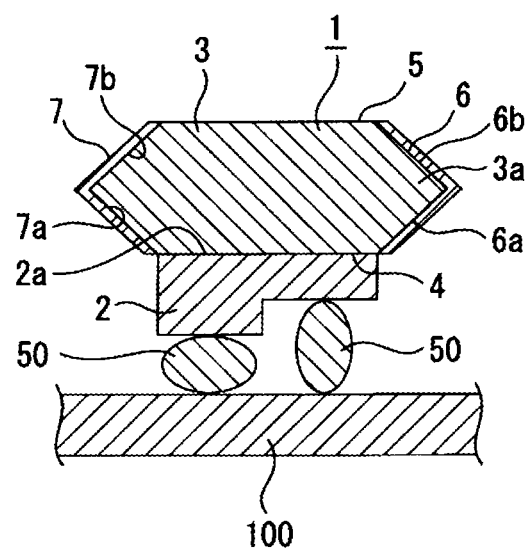
FIG. 2 is an enlarged cross-sectional view of a light emitting device that is mounted on a substrate according to embodiment 1.

The light emitting device 1 according to embodiment 1 includes a semiconductor light emitting element 2 and a wavelength conversion layer 3 that is arranged on the semiconductor light emitting element 2 (refer to FIGS. 1 and 2).

In the light emitting device 1, the semiconductor light emitting element 2 is connected to a wiring pattern (not illustrated) of a substrate 100, for example, through bumps 50 and 50 by flip-chip mounting. Further, the semiconductor light emitting element 2 may be mounted on the substrate 100 by various mounting methods such as face up mounting.

The base material of the substrate 100 is formed of various materials, such as aluminum nitride, alumina, silicon, mullite, and copper, and the wiring pattern is connected to a feeding circuit (not illustrated). Accordingly, a driving current from the feeding circuit is supplied to the semiconductor light emitting element 2 through the wiring pattern of the substrate 100.

As the semiconductor light emitting element 2, for example, a light emitting diode that emits blue light is used. Further, it is preferable that the semiconductor light emitting element 2 emits near ultraviolet rays or a visible light of a short wavelength. The lower surface of the semiconductor light emitting element 2 is mounted on the substrate 100, and the upper surface thereof is formed as an emitting surface 2a that emits light. The emitting surface 2a, for example, is in a rectangular shape.

As the wavelength conversion layer 3, for example, yellow phosphor, in which yellow light is excited by the light emitted from the semiconductor light emitting element 2, is used. As the wavelength conversion layer 3, for example, transparent ceramics obtained by sintering powder of YAG (Yttrium Aluminum Garnet) that is excited by ultraviolet rays are used. In the wavelength conversion layer 3, yellow light is excited as the blue light emitted from the semiconductor light emitting element is absorbed in the phosphor.

The lower surface of the waveform conversion layer 3 is formed as an input surface 4, and the input surface 4 is arranged in a downward direction to face the emitting surface 2a of the semiconductor light emitting element 2, and is in contact with the emitting surface 2a. The input surface 4 has the same shape and size as the emitting surface 2a. The upper surface of the wavelength conversion layer 3 is formed as an output surface 5, and the output surface 5 is positioned just above the input surface 4. Both the input surface 4 and the output surface 5 are in a rectangular shape, and have substantially the same area.

The side surface of the waveform conversion layer 3 becomes an outer peripheral surface 6. An upper edge of the outer peripheral surface 6 is continued to the outer periphery of the output surface 5, and a lower edge thereof is continued to the outer periphery of the input surface 4. The outer periphery of the wavelength conversion layer 3 is provided as a projecting portion 3a having an outwardly convex shape, and the projecting portion 3a is positioned on the outside of the input surface 4 and the output surface 5. The outer peripheral surface 6 is configured by first inclined parts 6a, 6a, . . . which are positioned on the side of the input surface 4 and are inclined to be displaced to the outside as they go upwardly, and second inclined parts 6b, 6b, which are positioned on the side of the output surface 5 and are inclined to be displaced to the outside as they go downwardly.

Four first inclined parts 6a, 6a, . . . and four second inclined parts 6b, 6b, . . . are formed in front, rear, left, and right directions, and are continued in the circumferential direction. However, at least one first inclined part 6a and at least one second inclined part 6b may be formed on the wavelength conversion layer 3. That is, it is preferable that a part of the outer periphery of the wavelength conversion layer 3 is provided as the projecting portion 3a that is convex outwardly, and the outer surface of the portion where the outwardly convex shape is not formed is a surface that is, for example, perpendicular to the input surface 4 and the output surface 5.

The lower edges of the first inclined parts 6a, 6a, . . . are continued to the outer periphery of the input surface 4 and are inclined toward the lower side. The upper edges of the second inclined parts 6b, 6b, . . . are continued to the outer periphery of the output surface 5 and the lower edges thereof are continued to the outer periphery of the first inclined parts 6a, 6a, . . . and are inclined toward the upper side.

On the outer peripheral surface 6 of the wavelength conversion layer 3, light reflection layers 7, 7, . . . that reflect the light incident through the input surface 4 are provided. The light reflection layer 7 is provided by depositing a material, for example, having high reflectivity such as aluminum on the outer peripheral surface 6. Further, the light reflection layer 7 may be any kind of layer that has a light reflecting property, and for example, may be a multilayer film in which a metal film except for aluminum, a dielectric having high refractive index, and a dielectric having low refractive index are combined.

Surfaces of the light reflection layers 7, 7, . . . that are in contact with the first inclined parts 6a, 6a, . . . are formed as the first reflection surfaces 7a, 7a, . . . , and surfaces of the light reflection layers 7, 7, . . . that are in contact with the second inclined parts 6b, 6b, . . . are formed as the second reflection surfaces 7b, 7b, . . . .

In the light emitting device 1 as configured above, if blue light is emitted from the semiconductor light emitting element 2, the light passes through the emitting surface 2a, and is incident to the wavelength conversion layer 3 through the input surface 4. The light that is incident to the wavelength conversion layer 3 is exited from the output surface 5 to the outside. At this time, a part of the light that is incident to the wavelength conversion layer 3 is reflected by the first reflection surfaces 7a, 7a, . . . and the second reflection surfaces 7b, 7b, . . . of the light reflection layer 7, and is exited from the output surface 5 to the outside.

If the light is incident from the semiconductor light emitting element 2 to the waveform conversion layer 3, a part of the blue light is absorbed in the phosphor to excite yellow light, and the blue light that has passed through the wavelength conversion layer 3 without being absorbed in the phosphor and the excited yellow light are mixed to emit pseudo white light to the outside.

In the light emitting device 1, since the first reflection surfaces 7a, 7a, . . . and the second reflection surfaces 7b, 7b, . . . of the light reflection layer 7 are inclined against the input surface 4, the reflection direction is changed and the number of reflections is decreased in the case where the reflection surface is perpendicular to the input surface 4. Accordingly, a heat loss due to the reflection is reduced, and the quantity of light that is exited from the output surface 5 to the outside is increased to improve the light emitting efficiency.

Further, since the second reflection surfaces 7b, 7b, . . . are provided, the area of the output surface 5 is not large in comparison to the area of the input surface 4, and thus the density (luminance) of light that is exited from the output surface 5 becomes increased.

Further, since the second reflection surfaces 7b, 7b, . . . are provided, the quantity of the light, which is emitted from the semiconductor light emitting element 2 and reaches the projecting portion 3a of the wavelength conversion layer 3, is increased, and the light excited through the phosphor and the light emitted from the semiconductor light emitting element 2 can be easily mixed to reduce the occurrence of the color non-uniformity.

<Embodiment 2>

Figure 3:
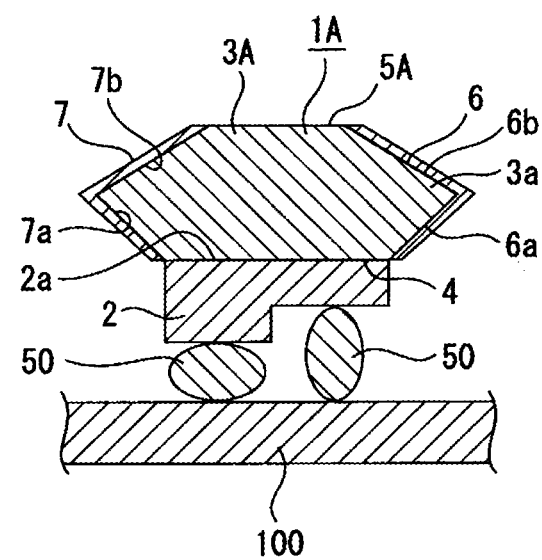
FIG. 3 is an enlarged cross-sectional view of a light emitting device that is mounted on a substrate according to embodiment 2.

A light emitting device 1A according to embodiment 2 has a semiconductor light emitting element 2 and a wavelength conversion layer 3A that is arranged on the semiconductor light emitting element 2 (refer to FIG. 3).

The upper surface of the wavelength conversion layer 3A is formed as an output surface 5A, and the area of the output surface 5A is set to be smaller than the area of the input surface 4. The area of the output surface 5A is, for example, about 80% of the area of the input surface 4.

In the light emitting device 1A, since the area of the output surface 5A is smaller than the area of the input surface 4, the density of the light exited from the output surface 5A can be increased.

<Embodiment 3>

Figure 4:
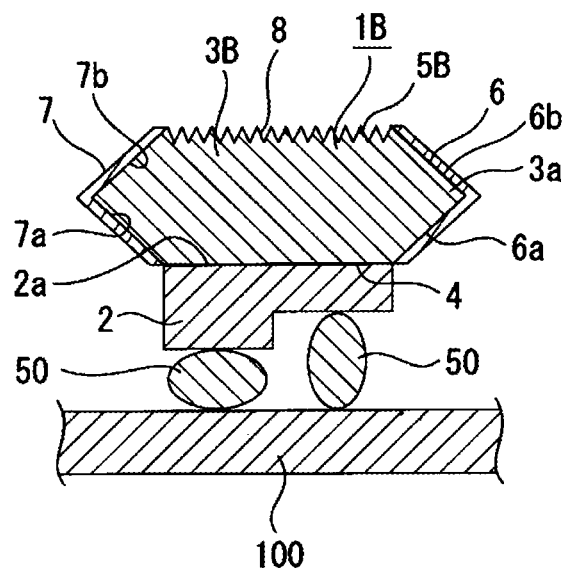
FIG. 4 is an enlarged cross-sectional view of a light emitting device that is mounted on a substrate according to embodiment 3.

A light emitting device 1B according to embodiment 3 has a semiconductor light emitting element 2 and a wavelength conversion layer 3B that is arranged on the semiconductor light emitting element 2 (refer to FIG. 4).

The upper surface of the wavelength conversion layer 3B is formed as an output surface 5B, and a minute concavo-convex shape 8 is formed on the output surface 5B. The concavo-convex portion 8 functions as a reflection suppression portion suppressing that the light incident to the wavelength conversion layer 3B through the input surface 4 is totally reflected by the output surface 5B.

In the light emitting device 1B, since the concavo-convex shape 8 is formed on the output surface 5B, it is suppressed that the light incident to the wavelength conversion layer 3B through the input surface 4 is totally reflected by the output surface 5B, and thus the light emitting efficiency can be improved.

<Embodiment 4>

Figure 5:
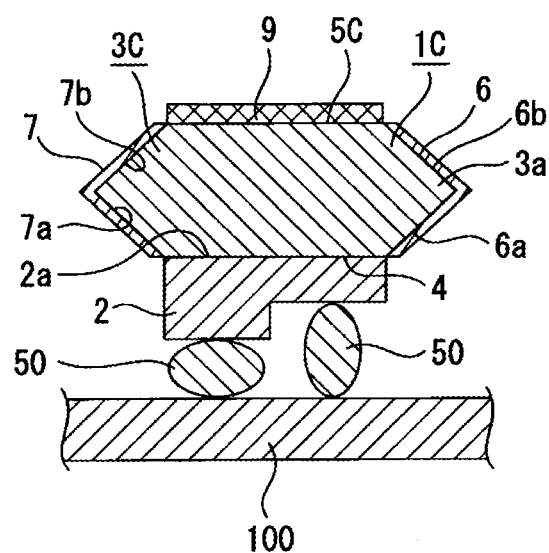
FIG. 5 is an enlarged cross-sectional view of a light emitting device that is mounted on a substrate according to embodiment 4.

A light emitting device 10 according to embodiment 4 has a semiconductor light emitting element 2 and a wavelength conversion layer 3C that is arranged on the semiconductor light emitting element 2 (refer to FIG. 5).

The upper surface of the wavelength conversion layer 3C is formed as an output surface 5C, and a reflection prevention film 9 is formed on the output surface 5C. The reflection prevention film 9 functions as a reflection suppression portion suppressing that the light incident to the wavelength conversion layer 3C through the input surface 4 is totally reflected by the output surface 5C.

In the light emitting device 10, since the reflection prevention film 9 is formed on the output surface 5C, it is suppressed that the light incident to the wavelength conversion layer 3C through the input surface 4 is totally reflected by the output surface 50, and thus the light emitting efficiency can be improved.

<Embodiment 5>

Figure 6:
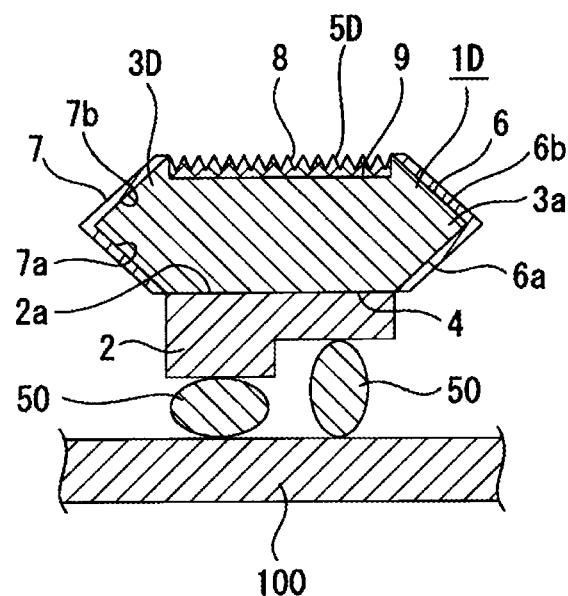
FIG. 6 is an enlarged cross-sectional view of a light emitting device that is mounted on a substrate according to embodiment 5.

A light emitting device 1D according to embodiment 5 has a semiconductor light emitting element 2 and a wavelength conversion layer 3D that is arranged on the semiconductor light emitting element 2 (refer to FIG. 6).

The upper surface of the wavelength conversion layer 3D is formed as an output surface 5D, and a concavo-convex shape 8 and a reflection prevention film 9 are formed and provided on the output surface 5D. The reflection prevention film 9 functions as a reflection suppression portion suppressing that the light incident to the wavelength conversion layer 3D through the input surface 4 is totally reflected by the output surface 5D.

In the light emitting device 1D, since the concavo-convex shape 8 are formed and the reflection prevention film 9 is provided on the output surface 5D, it is suppressed that the light incident to the wavelength conversion layer 3D through the input surface 4 is totally reflected by the output surface 5D, and thus the light emitting efficiency can be improved.

<Embodiment 6>

Figure 7:
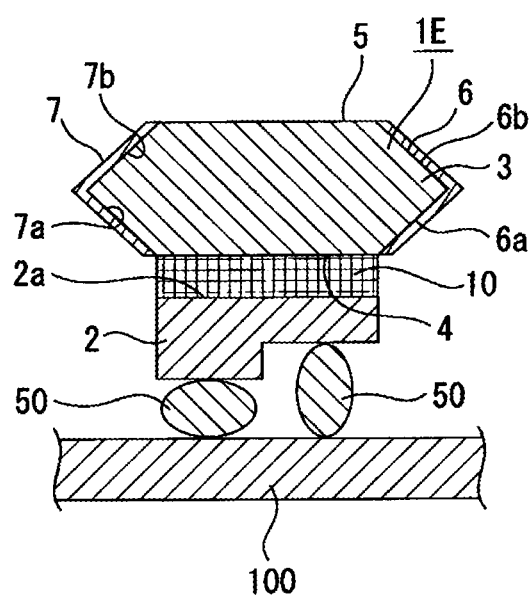
FIG. 7 is an enlarged cross-sectional view of a light emitting device that is mounted on a substrate according to embodiment 6.

A light emitting device 1E according to embodiment 6 has a semiconductor light emitting element 2 and a wavelength conversion layer 3E that is arranged on the semiconductor light emitting element 2 (refer to FIG. 7).

A band pass filter 10 is arranged between the emitting surface 2a of the semiconductor light emitting element 2 and the input surface 4 of the wavelength conversion layer 3. The band pass filter 10 has a function of transmitting light of a specified wavelength region, and is configured not to transmit the yellow light. Accordingly, the light emitted from the semiconductor light emitting element 2 is incident to the wavelength conversion layer 3 from the emitting surface 2a through the band pass filter 10, and the yellow light that is excited when the blue light is absorbed in the phosphor is reflected by the band pass filter 10 and is directed toward the side of the output surface 5.

In the light emitting device 1E, since the band pass filter 10 is arranged between the semiconductor light emitting element 2 and the wavelength conversion layer 3, the yellow light that is directed toward the side of the semiconductor light emitting element 2 is not incident to the semiconductor light emitting element 2, and the quantity of yellow light exited from the output surface 5 is increased. Accordingly, the light emitting efficiency can be improved.

<Embodiment 7>

Figure 8:
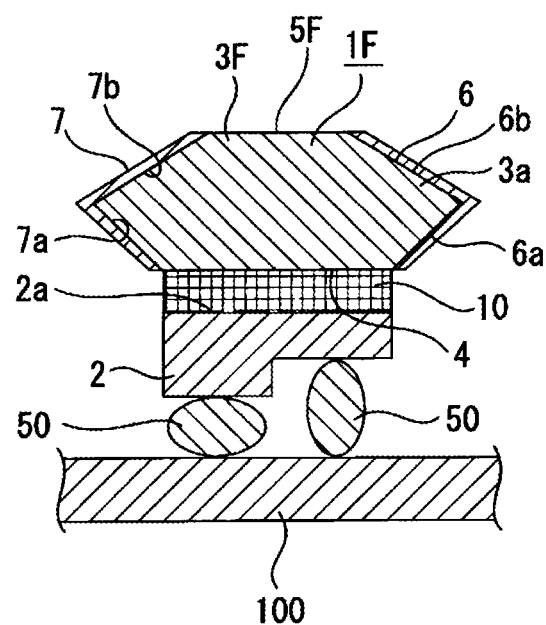
FIG. 8 is an enlarged cross-sectional view of a light emitting device that is mounted on a substrate according to embodiment 7.

A light emitting device 1F according to embodiment 7 has a semiconductor light emitting element 2 and a wavelength conversion layer 3F that is arranged on the semiconductor light emitting element 2 (refer to FIG. 8).

The upper surface of the wavelength conversion layer 3F is formed as an output surface 5F, and the area of the output surface 5F is smaller than the area of the input surface 4.

A band pass filter 10 is arranged between the emitting surface 2a of the semiconductor light emitting element 2 and the input surface 4 of the wavelength conversion layer 3F.

In the light emitting device 1F, since the area of the output surface 5F is smaller than the area of the input surface 4, the density of the light exited from the output surface 5F can be increased.

Further in the light emitting device 1F, since the band pass filter 10 is arranged between the semiconductor light emitting element 2 and the wavelength conversion layer 3F, the yellow light that is directed toward the side of the semiconductor light emitting element 2 is not incident to the semiconductor light emitting element 2, and the quantity of the yellow light exited from the output surface 5F is increased. Accordingly, the light emitting efficiency can be improved.

<Embodiment 8>

Figure 9:
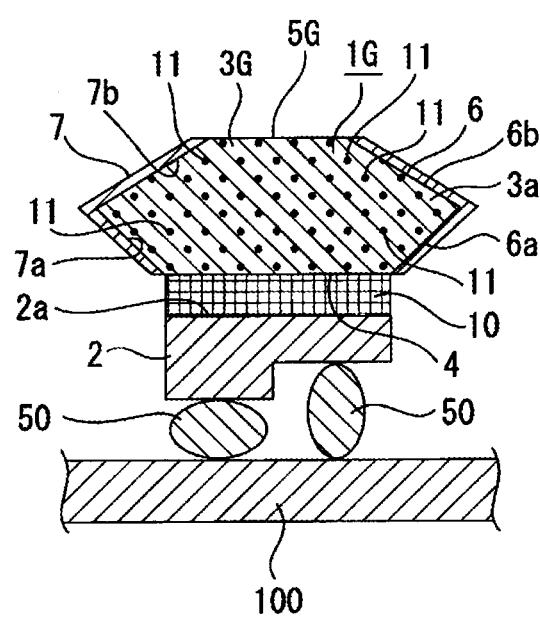
FIG. 9 is an enlarged cross-sectional view of a light emitting device that is mounted on a substrate according to embodiment 8.

A light emitting device 1G according to embodiment 8 has a semiconductor light emitting element 2 and a wavelength conversion layer 3G that is arranged on the semiconductor light emitting element 2 (refer to FIG. 9).

The upper surface of the wavelength conversion layer 3G is formed as an output surface 5G, and the area of the output surface 5G is smaller than the area of the input surface 4.

A band pass filter 10 is arranged between the emitting surface 2a of the semiconductor light emitting element 2 and the input surface 4 of the wavelength conversion layer 3G.

Diffusion components 11, 11, . . . are contained in the wavelength conversion layer 3G. The diffusion components 11, 11, . . . are formed of a material that has a refractive index different from that of the main component of the wavelength conversion layer 3G.

The diffusion components 11, 11, . . . may be made of the same material as the main component of the wavelength conversion layer 3G, and in this case, the main component and the diffusion component 11 may be, for example, amorphous phase and crystalline phase in a semi-transparent resin such as polypropylene, rutile phase and anatase phase in titanium oxide of an inorganic material, and garnet phase and perovskite phase in alumina-yttrium oxide processes.

Further, a material having a refractive index that is different from the refractive index of the phosphor may be added to the wavelength conversion layer G as the diffusion components 11, 11, . . . , and addition of the diffusion components 11, 11, . . . may be, for example, addition of phosphor particles into transparent resin or glass, addition of silica or alumina, or addition of air or gas (bubble) such as nitrogen gas.

Further, the light diffusion layer formed on the surface of the wavelength conversion layer 3G may be used as the diffusion components 11, 11, . . . , and in this case, acrylic transparent resin containing silica particles may be applied onto the surface of the wavelength conversion layer 3G, or the acrylic transparent resin may be formed thick to be used as a diffusion plate.

In the light emitting device 1G, since the area of the output surface 5G is smaller than the area of the input surface 4, the density of the light exited from the output surface 5G can be increased.

Further, in the light emitting device 1G, since the band pass filter 10 is arranged between the semiconductor light emitting element 2 and the wavelength conversion layer 3G, the yellow light that is directed toward the side of the semiconductor light emitting element 2 is not incident to the semiconductor light emitting element 2, and the quantity of the yellow light exited from the output surface 5G is increased. Accordingly, the light emitting efficiency can be improved.

Further, in the light emitting device 1G, since the diffusion components 11, 11, . . . are contained in the wavelength conversion layer 3G, the light is diffused in the wavelength conversion layer 3G, and the propagation direction thereof is changed. Accordingly, the light emitting efficiency can be improved.

<Embodiment 9>

Figure 10:
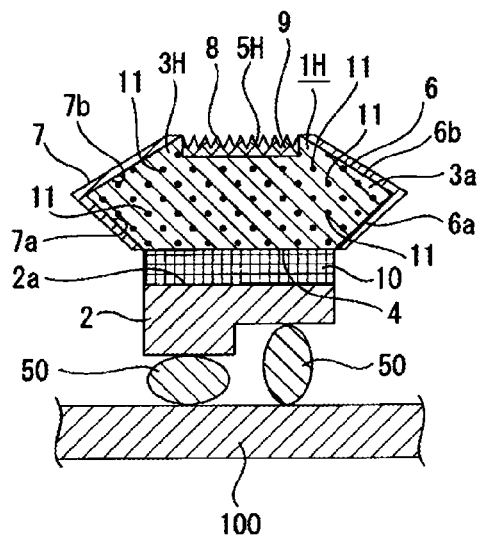
FIG. 10 is an enlarged cross-sectional view of a light emitting device that is mounted on a substrate according to embodiment 9.

A light emitting device 1H according to embodiment 9 has a semiconductor light emitting element 2 and a wavelength conversion layer 3H that is arranged on the semiconductor light emitting element 2 (refer to FIG. 10).

The upper surface of the wavelength conversion layer 3H is formed as an output surface 5H, and the area of the output surface 5H is smaller than the area of the input surface 4. On the output surface 5H, a minute concavo-convex shape 8 is formed and a reflection prevention film 9 is provided.

A band pass filter 10 is arranged between the emitting surface 2a of the semiconductor light emitting element 2 and the input surface 4 of the wavelength conversion layer 3H.

Diffusion components 11, 11, . . . are contained in the wavelength conversion layer 3H.

In the light emitting device 1H, since the area of the output surface 5H is smaller than the area of the input surface 4, the density of the light exited from the output surface 5H can be increased.

Further, in the light emitting device 1H, since the concavo-convex shape 8 is formed on the output surface 5H, it is suppressed that the light incident to the wavelength conversion layer 3H through the input surface 4 is totally reflected by the output surface 5H, and the light emitting efficiency can be improved.

Further, in the light emitting device 1H, since the reflection prevention film 9 is provided on the output surface 5H, it is further suppressed that the light incident to the wavelength conversion layer 3H through the input surface 4 is totally reflected by the output surface 5H, and thus the light emitting efficiency can be further improved.

Further, in the light emitting device 1H, since the band pass filter 10 is arranged between the semiconductor light emitting element 2 and the wavelength conversion layer 3H, the yellow light that is directed toward the side of the semiconductor light emitting element 2 is not incident to the semiconductor light emitting element 2, and the quantity of the yellow light exited from the output surface 5H is increased. Accordingly, the light emitting efficiency can be further improved.

Further, in the light emitting device 1H, since the diffusion components 11, 11, . . . are contained in the wavelength conversion layer 3H, the light is diffused in the wavelength conversion layer 3H, and the propagation direction thereof is changed. Accordingly, the light emitting efficiency can be further improved.

<Embodiment 10>

Figure 11:
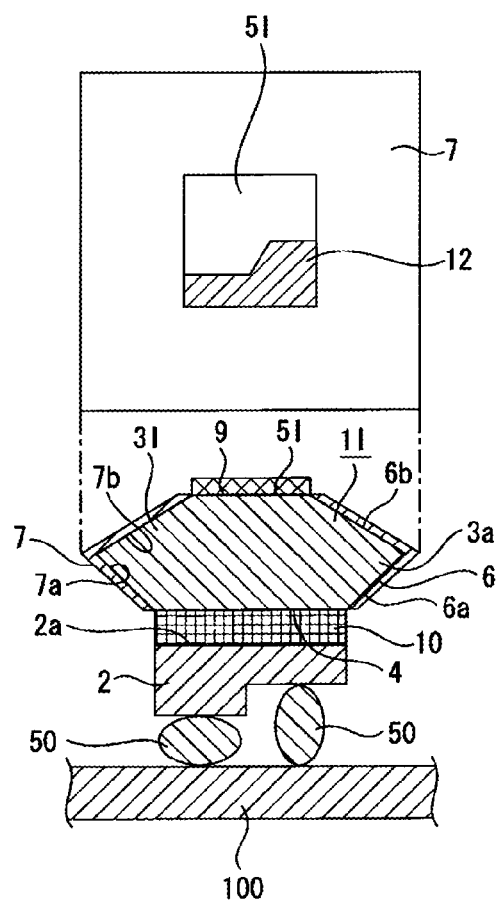
FIG. 11 is an enlarged cross-sectional view of a light emitting device that is mounted on a substrate according to embodiment 10.

A light emitting device 1I according to embodiment 10 has a semiconductor light emitting element 2 and a wavelength conversion layer 3I that is arranged on the semiconductor light emitting element 2 (refer to FIG. 11).

The upper surface of the wavelength conversion layer 3I is formed as an output surface 5I, and the area of the output surface 5I is smaller than the area of the input surface 4. On the output surface 5I, a reflection prevention film 9 is provided.

A band pass filter 10 is arranged between the emitting surface 2a of the semiconductor light emitting element 2 and the input surface 4 of the wavelength conversion layer 3I.

A shielding film 12 that forms a cut line in a light distribution pattern of a vehicle headlight is formed on the output surface 5I.

In the light emitting device 1I, since the area of the output surface 5I is smaller than the area of the input surface 4, the density of the light exited from the output surface 5I can be increased.

Further, in the light emitting device 1I, since the reflection prevention film 9 is provided on the output surface 5I, it is further suppressed that the light incident to the wavelength conversion layer 3I through the input surface 4 is totally reflected by the output surface 5I, and thus the light emitting efficiency can be further improved.

Further, in the light emitting device 1I, since the band pass filter 10 is arranged between the semiconductor light emitting element 2 and the wavelength conversion layer 3I, the yellow light that is directed toward the side of the semiconductor light emitting element 2 is not incident to the semiconductor light emitting element 2, and the quantity of the yellow light exited from the output surface 5I is increased. Accordingly, the light emitting efficiency can be further improved.

Further, in the light emitting device 1I, the shielding film 12 is formed, and in the case of using the light emitting device in the vehicle headlight, the cut line can be formed in the light distribution pattern without using a shade. Accordingly, the vehicle headlight can be miniaturized and the manufacturing cost thereof can be reduced.

<Others>

Although in the above-described embodiment 2 to embodiment 10, making the area of the output surface 5 (5A, 5B, . . . ) smaller than the area of the input surface, providing the concavo-convex shape 8, providing the reflection prevention film 9, providing the band pass filter 10, providing the diffusion component 11, and forming the shielding film 12 are presented as means for seeking the improvement of the light emitting efficiency. However, it is also possible to optionally combine the above-described means.

FIG. 12 is a table showing respective means used for two comparative examples hereinafter, in addition to the above-described embodiment 1 to embodiment 10, and the results of measuring luminance in the respective embodiments and comparative examples.

Figure 13:
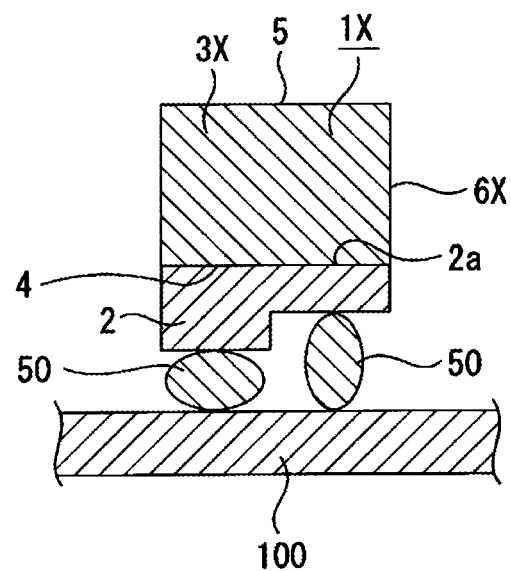
FIG. 13 is an enlarged cross-sectional view of a light emitting device that is mounted on a substrate according to comparative example 1.

The light emitting device 1X according to comparative example 1 is an example in which the outer peripheral surface 6X is formed in a direction that is perpendicular to the input surface 4 and the light reflection layer 7 is not provided (refer to FIG. 13). Accordingly, in the light emitting device 1X, a wavelength conversion layer 3X that has no projection forming portion is provided.

Figure 14:
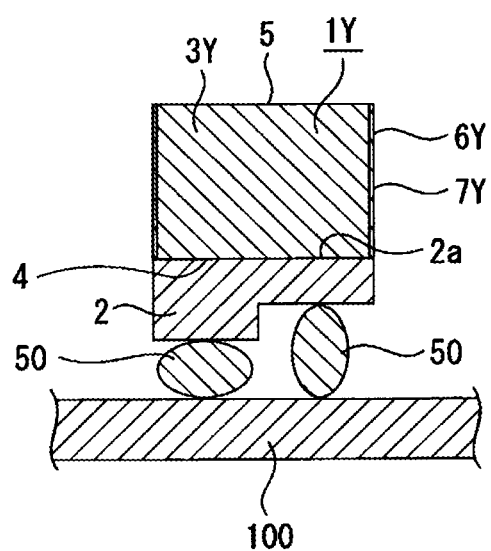
FIG. 14 is an enlarged cross-sectional view of a light emitting device that is mounted on a substrate according to comparative example 2.

The light emitting device 1Y according to comparative example 2 is an example in which the outer peripheral surface 6Y is formed in a direction that is perpendicular to the input surface 4 and the light reflection layer 7Y is provided (refer to FIG. 14). Accordingly, in the light emitting device 1Y, a wavelength conversion layer 3Y that has no projection forming portion is provided.

Relative luminance values are shown based on the luminance of comparative example 1. According to the light emitting devices 1 to 1I according to embodiments 1 to 10, the luminance therein is higher than the luminance in the light emitting device 1X according to comparative example 1 and the light emitting device 1Y according to comparative example 2, and the light emitting device 1H according to embodiment 9 shows the maximum value.

Accordingly, it can be confirmed that the light emitting efficiency can be improved in the light emitting device 1 to the light emitting device 1I according to embodiment 1 to embodiment 10.

<Manufacturing Method>

Then, a method for manufacturing a wavelength conversion layer 3 and a light reflection layer 7 will be described (FIGS. 15 to 19). Further, FIGS. 15 to 19 shown with respect to the manufacturing method are simplified for easy explanation.

The shape of the wavelength conversion layer 3 can be formed by various processing methods such as mechanical, physical, and chemical processing methods. The mechanical processing method may be, for example, a method that is performed using a drill, a blade, or a whetstone. The physical processing method may be, for example, a blast method to perform grinding by making particles collide with a material (work) or a method to perform cutting by making plasma generated at low pressure collide with a material. The chemical processing method may be, for example, a method to perform cutting by etching using acid or alkaline solvent or by making reactive plasma collide with a material. Further, the forming of the shape of the wavelength conversion layer 3 may be performed by combining various processing methods such as the mechanical, physical, and chemical processing methods.

Hereinafter, concrete examples of the method for manufacturing a wavelength conversion layer 3 and a light reflection layer 7 will be described.

Figure 15:
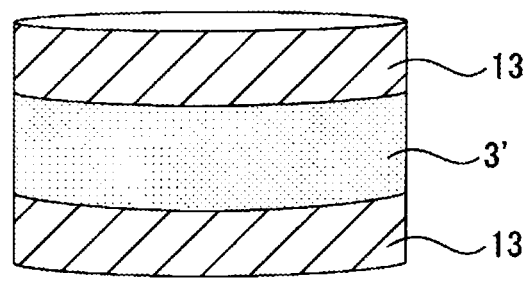
FIG. 15 illustrates a method for manufacturing a wavelength conversion layer and a light reflection layer together with FIGS. 16 to 19, and is a conceptual view illustrating a state where resist is applied on a material of a wavelength conversion layer.

First, as a material 3' formed as the wavelength conversion layer 3, resist 13, 13 is applied on both surfaces of transparent ceramics, for example, on which power of YAG is sintered (refer to FIG. 15).

Figure 16:
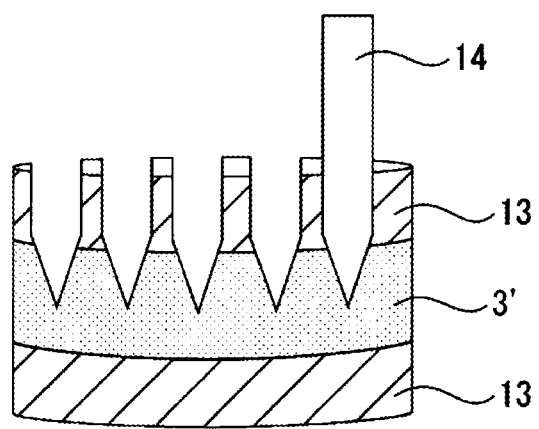
FIG. 16 is a conceptual view illustrating a state where a material or the like is cut by a diamond saw from one side.

Then, predetermined portions of the resist 13 and the material 3' are cut from one side using a dicing saw 14 having a front end to which diamond particles are added (refer to FIG. 16). The blade end of the dicing saw 14 has, for example, an angle of 45°. At this time, the respective portions are cut in four directions of front, rear, left, and right.

Figure 17:
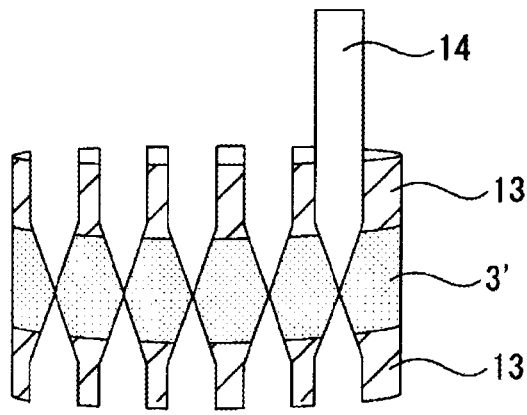
FIG. 17 is a conceptual view illustrating a state where a material or the like is cut by a diamond saw from the other side.

Then, the material 3' and the resist 13, 13 are reversed, and predetermined portions of the resist 13 and the material 3' are cut from the other side using the dicing saw 14 (refer to FIG. 17). At this time, the respective portions are cut in four directions of front, rear, left, and right.

Figure 18:
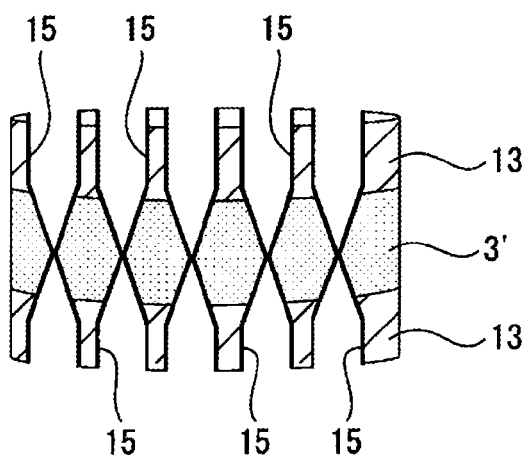

Then, deposition films 15, 15, . . . , such as aluminum, are formed on the surfaces of the resist 13, 13 and the material 3' in a low-pressure pot (refer to FIG. 18). The deposition films 15, 15, . . . are portions that are formed as the light reflection layers 7, 7, . . . .

Figure 19:
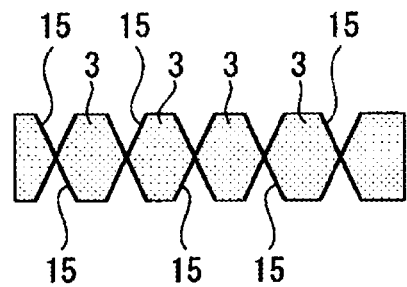
FIG. 19 is a conceptual view illustrating a state where resist is peeled off and a wavelength conversion layer, to which a light reflection layer is attached, is formed.

Lastly, by peeling off the resist 13, 13, a plurality of wavelength conversion layers 3, 3, . . . to which respective light reflection layers 7,7, . . . are attached, are formed (refer to FIG. 19).

As described in the above, according to the light emitting devices 1 to 1I of embodiments 1 to 10, since the first reflection surfaces 7a, 7a, . . . and the second reflection surfaces 7b, 7b, . . . of the light reflection layer 7 are inclined, the quantity of light exited to the outside is increased, and thus the light emitting efficiency can be improved.

Further, since the second reflection surfaces 7b, 7b, . . . are provided, the quantity of the light, which is emitted from the semiconductor light emitting element 2 and reaches the wavelength conversion layer 3 or the projecting portion 3a of the wavelength conversion layer 31, is increased, and thus the occurrence of the color non-uniformity can be reduced.

The shape and structure of each portion illustrated in the embodiments and modifications are merely examples for performing the present invention. All features or combinations of the features of the embodiments and the modifications are not always essential to the invention.

In accordance with an embodiment, a light emitting device may include a semiconductor light emitting element and a wavelength conversion layer. The semiconductor light emitting element may include an emitting surface. The wavelength conversion layer may include: an input surface which is positioned to face the emitting surface of the semiconductor light emitting element and to which light emitted from the emitting surface of the semiconductor light emitting element is incident; an output surface from which the light that is incident to the input surface is emitted to an outside; and an outer peripheral portion positioned between the input surface and the output surface. At least a part of the outer peripheral portion of the wavelength conversion layer may include a projecting portion that is convex to an outer side. The projecting portion may have a first inclined part continued from the input surface and a second inclined part continued from the output surface. A light reflection layer may be provided on the outer peripheral portion of the wavelength conversion layer to reflect the light incident through the input surface. A first reflection surface that is in contact with the first inclined part and a second reflection surface that is in contact with the second inclined part may be formed on the light reflection layer.

According to this structure, since the first reflection surface and the second reflection surface of the light reflection layer are inclined with respect to the input surface, the quantity of light that is emitted to the outside is increased, and thus the light emitting efficiency can be improved.

Further, since the second reflection surface is provided, the quantity of the light, which is emitted from the semiconductor light emitting element and reaches the projecting portion of the wavelength conversion layer, is increased, and the occurrence of the color non-uniformity can be reduced.

In the above structure, an area of the output surface may be smaller than an area of the input surface.

According to this structure, the density of light that is exited from the output surface can be increased.

In the above structure, a reflection suppression portion may be provided on the output surface in order to suppress that the light incident through the input surface is totally reflected on the output surface.

According to this structure, the total reflection of the light incident to the wavelength conversion layer through the input surface by the output surface is suppressed, and the light emitting efficiency can be improved.

In the above structure, a band pass filter that transmits light having a predetermined wavelength may be provided between the emitting surface of the semiconductor light emitting element and the input surface of the wavelength conversion layer.

According to this structure, since the light, which is generated through excitation in the wavelength conversion layer that faces the semiconductor light emitting element side, is not incident to the semiconductor light emitting element, the quantity of the light that is exited from the output surface is increased, and thus the light emitting efficiency can be improved.

In the above structure, a diffusion component that diffuses the light may be provided on the surfaces or an inside of the wavelength conversion layer.

According to this structure, the light is diffused on the wavelength conversion layer to change the propagating direction thereof, the light emitting efficiency can be improved.

In the above structure, the light emitting device may be used as a light emitting portion of a vehicle headlight. A shielding film that forms a cut line in a light distribution pattern of the vehicle headlight may be provided on the output surface of the wavelength conversion layer.

According to this structure, when the light emitting device in the vehicle headlight, since the cut line is formed in the light distribution pattern without using a shade, the vehicle headlight can be miniaturized and the manufacturing cost thereof can be reduced.

Moreover, in accordance with an embodiment of the invention, as shown in the figures, a light emitting device (1, 1A, 1B, 1C, 1D, 1E, 1F, 1G, 1H, 1I) may include: a semiconductor light emitting element (2) including an emitting surface (2a) substantially perpendicular to an emitting direction; and a wavelength conversion portion (3, 3A, 3B, 3C, 3D, 3F, 3G, 3H, 3I). The wavelength conversion portion (3, 3A, 3B, 3C, 3D, 3F, 3G, 3H, 3I) may include: an input surface (4) faced the emitting surface (2a) in the emitting direction; an output surface (5, 5A, 5B, 5C, 5D, 5F, 5G, 5H, 5I) provided in an opposite side of the input surface (4) in the emitting direction;

and an outer peripheral portion (6) positioned between the input surface (4) and the output surface (5, 5A, 5B, 5C, 5D, 5F, 5G, 5H, 5I). The outer peripheral portion (6) may include a first inclined part (6a) at a side of the input surface (4) and a second inclined part (6b) at a side of the output surface (5, 5A, 5B, 5C, 5D, 5F, 5G, 5H, 5I). The first inclined part (6a) may incline with respect to the emitting direction, the second inclined part (6b) may incline with respect to the emitting direction, and the first inclined part (6a) and the second inclined part (6b) may define a projecting portion (3a) that is projected in a direction perpendicular to the emitting direction on the outer peripheral portion (6). A first reflection surface (7a) may be provided on the first inclined part (6a) and a second reflection surface (7b) may be provided on the second inclined part (6b).

What is claimed is:

1. A light emitting device comprising:
    a semiconductor light emitting element including an emitting surface; and
    a wavelength conversion layer including:
        an input surface which is positioned to face the emitting surface of the semiconductor light emitting element and to which light emitted from the emitting surface of the semiconductor light emitting element is incident;
        an output surface from which the light that is incident to the input surface is emitted to an outside; and
        an outer peripheral portion positioned between the input surface and the output surface,
    wherein at least a part of the outer peripheral portion of the wavelength conversion layer includes a projecting portion that is convex to an outer side,
    wherein the projecting portion has a first inclined part continued from the input surface and a second inclined part continued from the output surface,
    wherein a light reflection layer is provided on the outer peripheral portion of the wavelength conversion layer to reflect the light incident through the input surface, and
    wherein a first reflection surface that is in contact with the first inclined part and a second reflection surface that is in contact with the second inclined part are formed on the light reflection layer.

2. The light emitting device according to claim 1, wherein an area of the output surface is smaller than an area of the input surface.

3. The light emitting device according to claim 1, further comprising:
    a reflection suppression portion provided on the output surface to suppress such that the light incident through the input surface is totally reflected on the output surface.

4. The light emitting device according to claim 1, wherein a band pass filter that transmits light having a predetermined wavelength is provided between the emitting surface of the semiconductor light emitting element and the input surface of the wavelength conversion layer.

5. The light emitting device according to claim 1, wherein a diffusion component that diffuses the light is provided inside the wavelength conversion layer.

6. The light emitting device according to of claim 1, wherein the light emitting device is used as a light emitting portion of a vehicle headlight, and
    wherein a shielding film that forms a cut line in a light distribution pattern of the vehicle headlight is provided on the output surface of the wavelength conversion layer.

7. The light emitting device according to claim 1, wherein the light reflection layer is a film.

8. The light emitting device according to claim 1, wherein the input surface of the wavelength conversion layer and the emitting surface of the semiconductor light emitting element have substantially the same shape and substantially the same size.

9. A light emitting device comprising:
    a semiconductor light emitting element including an emitting surface substantially perpendicular to an emitting direction; and
    a wavelength conversion portion including:
        an input surface facing the emitting surface in the emitting direction, wherein the input surface of the wavelength conversion portion and the emitting surface of the semiconductor light emitting element have substantially the same shape and substantially the same size;
        an output surface provided in an opposite side of the input surface in the emitting direction; and
        an outer peripheral portion positioned between the input surface and the output surface,
    wherein the outer peripheral portion includes a first inclined part at a side of the input surface and a second inclined part at a side of the output surface,
    wherein the first inclined part inclines with respect to the emitting direction, the second inclined part inclines with respect to the emitting direction, and the first inclined part and the second inclined part define a projecting portion that is projected in a direction perpendicular to the emitting direction on the outer peripheral portion, and
    wherein a first reflection surface is provided on the first inclined part and a second reflection surface is provided on the second inclined part.

* * * * *